(12) United States Patent
Webb

(10) Patent No.: US 10,170,449 B2
(45) Date of Patent: Jan. 1, 2019

(54) DEFORMABLE CLOSED-LOOP MULTI-LAYERED MICROELECTRONIC DEVICE

(71) Applicant: International Business Machines Corporation, Armonk, NY (US)

(72) Inventor: Bucknell C. Webb, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 77 days.

(21) Appl. No.: 15/584,856

(22) Filed: May 2, 2017

(65) Prior Publication Data

US 2018/0323171 A1 Nov. 8, 2018

(51) Int. Cl.
*H01L 25/065* (2006.01)
*H01L 23/00* (2006.01)
*H01L 29/06* (2006.01)

(52) U.S. Cl.
CPC .......... *H01L 25/0657* (2013.01); *H01L 24/32* (2013.01); *H01L 29/0657* (2013.01); *H01L 2224/32145* (2013.01); *H01L 2225/06527* (2013.01); *H01L 2225/06555* (2013.01); *H01L 2225/06593* (2013.01); *H01L 2924/1011* (2013.01); *H01L 2924/10157* (2013.01)

(58) Field of Classification Search
CPC ....... B81B 3/0035; B81B 3/0059; B81B 5/00; H01L 23/5387
USPC ..................................... 257/532; 351/159.03
See application file for complete search history.

(56) References Cited

U.S. PATENT DOCUMENTS

| | | |
|---|---|---|
| 5,285,398 A | 2/1994 | Janik et al. |
| 6,137,675 A | 10/2000 | Perkins et al. |
| 6,785,144 B1 | 8/2004 | Akram |
| 6,992,376 B2 | 1/2006 | Jaeck et al. |
| 7,675,164 B2 | 3/2010 | Bartley et al. |
| 8,080,736 B2 | 12/2011 | Denatale et al. |
| 8,559,181 B2 | 10/2013 | Clayton et al. |
| 2010/0165562 A1 | 7/2010 | Segaram |
| 2012/0235277 A1 | 9/2012 | Pugh et al. |
| 2014/0090243 A1 | 4/2014 | Primavera |
| 2014/0107445 A1* | 4/2014 | Liu ..................... A61B 5/0004 600/345 |

(Continued)

FOREIGN PATENT DOCUMENTS

JP 4115257 B2 4/2008

*Primary Examiner* — David Vu
*Assistant Examiner* — Brandon Fox
(74) *Attorney, Agent, or Firm* — Scully, Scott, Murphy & Presser, P.C.; L. Jeffrey Kelly, Esq.

(57) ABSTRACT

A deformable closed-loop multi-layered microelectronic device is provided. A top layer, a bottom layer and a middle layer of the microelectronic device each have at least a first section and a second section pivotable with respect to each other. A pivot is provided to a terminal end of the first section of the middle layer, for allowing the first section to rotate about the pivot. The pivot is vertically sandwiched between and connected to a terminal end of the first section of the top layer and a terminal end of the first section of the bottom layer. The first sections of the bottom layer and the top layer are pivotable in a substantially synchronized manner to deform the bottom layer and the top layer in a substantially synchronized manner.

16 Claims, 7 Drawing Sheets

(56) References Cited

U.S. PATENT DOCUMENTS

2015/0287960 A1* 10/2015 Andry .................. C25D 1/04
 351/159.39
2015/0323811 A1* 11/2015 Flitsch .................. G02C 7/04
 351/159.03

* cited by examiner

100

DEFORMABLE CLOSED-LOOP MULTI-LAYERED MICROELECTRONIC DEVICE

BACKGROUND

The present disclosure and embodiments thereof are in the field of microelectronic devices and the method for manufacturing the same. More particularly, the present disclosure relates to a deformable closed-loop multi-layered material structure, which can be used with healthcare, medical, personal and communicational microelectronics.

Patterned electronic microstructures (or substrates) have gained popularity in the field of healthcare, medical, personal and communicational microelectronics, in that the patterned electronic microstructures can be manufactured economically through sheet/roll or wafer based microlithography. Depending on the circumstances of application, certain patterned electronic microstructures require non-planar closed loop structures. For example, cone shaped electronic microstructures, which are provided with batteries and silicon dies, can be embedded into contact lenses to provided so-called active lenses; tubular shaped electronic microstructures can be used as biological tubular structures or as a drug delivery mechanism. Conventionally, the non-planar patterned electronic microstructures are manufactured by building and coupling numerous individual flat microstructures (for example, arcs for cone shaped electronic microstructures and strips for tubular electronic microstructures). For each individual flat microstructure, multiple layers of polymers are stacked as films or sheets, which are formed with patterned metal films. For conventionally made electronic microstructures, each flat microstructure is extremely small and needs to be individually formed into its final shape, which elevates the difficulties for manufacturing. After the manufacture of the individual flat microstructures, they are mechanically and electrically coupled to each other to provide final non-planar devices. In generally, conventionally made electronic microstructures are structurally complex and costly to manufacture and the non-planar profile of the final products cannot be ensured.

Accordingly, there exists a need in the art to overcome the deficiencies and limitations described hereinabove with respect to conventional non-planar closed loop structures that can be used with healthcare, medical, personal and communicational microelectronics.

SUMMARY

In one aspect of the present application, a deformable closed-loop multi-layered microelectronic device is provided. The microelectronic device includes a top layer, which includes at least a first section and a second section. The first section and the second section of the top layer are pivotable with respect to each other to deform the top layer. The microelectronic device also includes a bottom layer, which includes at least a first section and a second section. The first section of the bottom layer is vertically aligned with the first section of the top layer. The second section of the bottom layer is vertically aligned with the second section of the top layer. The first section and the second section of the bottom layer are pivotable with respect to each other to deform the bottom layer. The microelectronic device further includes a middle layer disposed between the top layer and the bottom layer. The middle layer includes at least a first section and a second section, which are pivotable with respect to each other to deform the middle layer. The middle layer includes a first pivot provided to a first terminal end of the first section of the middle layer for allowing the first section to rotate about the first pivot. The first terminal end of the first section of the middle layer is vertically sandwiched between a first terminal end of the first section of the top layer and a first terminal end of the first section of the bottom layer. The first pivot is connected to the first terminal end of the first section of the bottom layer through a first adhesive and connected to the first terminal end of the first section of the top layer through a second adhesive, such that the first section of the bottom layer and the first section of the top layer are pivotable in a substantially synchronized manner to deform the bottom layer and the top layer in a substantially synchronized manner.

DETAILED DESCRIPTION OF EMBODIMENTS

Figure 1:
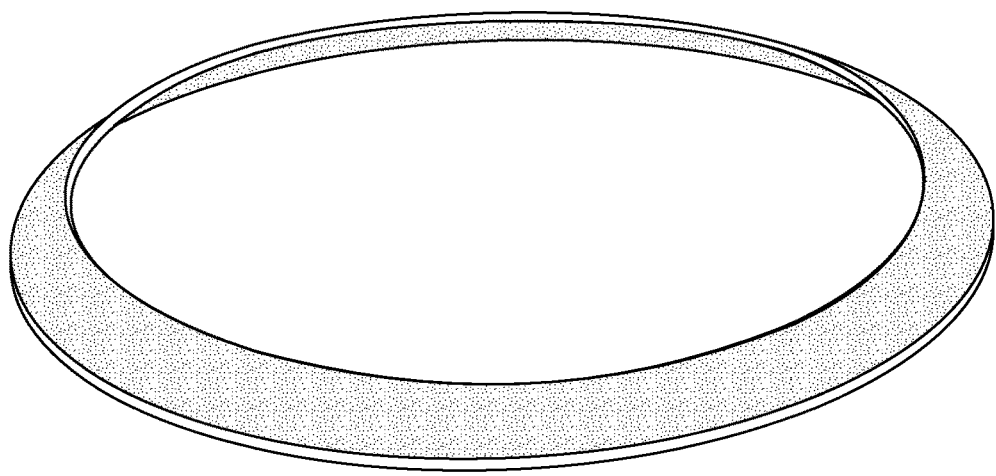
FIG. 1 is a schematic perspective view of a deformable closed-loop multi-layered microelectronic device according to an exemplary embodiment of the present disclosure, wherein the microelectronic device is deformed into a cone-shaped structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

Detailed embodiments of the methods and apparatuses of the present disclosure are described herein; however, it is to be understood that the disclosed embodiments are merely illustrative of the disclosed methods and apparatuses that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 2:
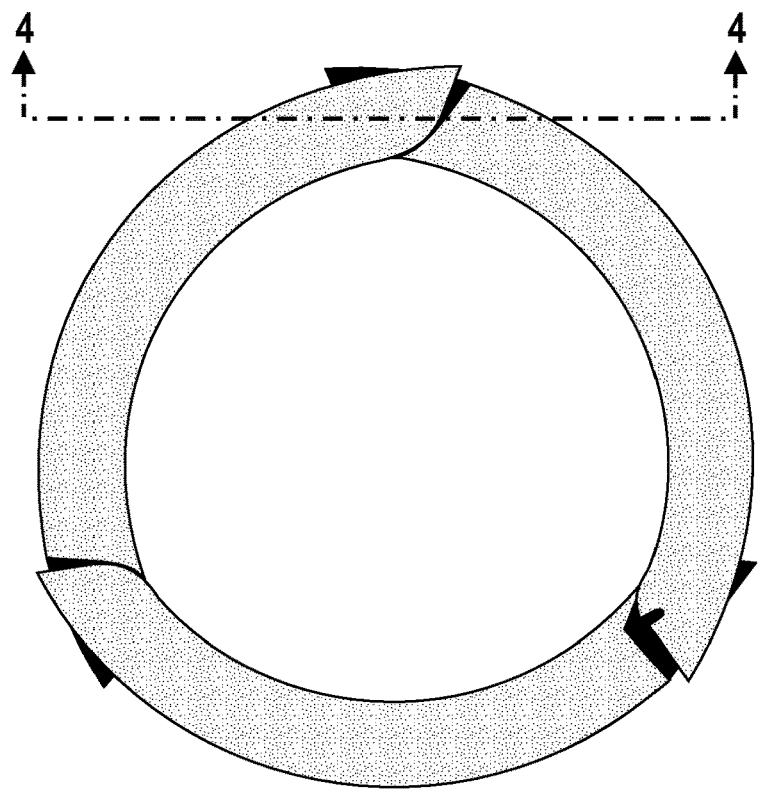
FIG. 2 is a schematic top view of the deformable closed-loop multi-layered microelectronic device of FIG. 1, prior to the deformation of the microelectronic device.

FIG. 1 is a schematic perspective view of a deformable closed-loop multi-layered microelectronic device 100, according to an exemplary embodiment of the present disclosure. The deformable closed-loop multi-layered microelectronic device 100 is initially formed as a flat structure in the flat geometry (as shown in FIG. 2). The deformable closed-loop multi-layered microelectronic device 100 can be subsequently deformed into a three-dimensional non-planar configuration, without requiring additional aligning and joining processes. For example, the cone-shaped structure shown in FIG. 1 can be provided with batteries and dies and can be fitted around the perimeter of a lens to provide a so-called active lens. Without departing from the spirit of the disclosure, the deformable closed-loop multi-layered microelectronic device can include other non-planar configuration, such as, a cylindrical suitable for drug-delivery ducts. The entire deformable closed-loop multi-layered microelectronic device 100 can be formed as a flat structure in the flat geometry, through, for example, a wafer, sheet or roll parallel process due to its unique structural features, which will be described with reference to FIGS. 2-4. For example, the deformable closed-loop multi-layered microelectronic device 100 can be a semiconductor or material structure processed using semiconductor photo-lithographic methods.

FIG. 2 is a schematic top view of the deformable closed-loop multi-layered microelectronic device 100, when the semiconductor structure is formed in the flat geometry, prior to the deformation of the microelectronic device 100 into its cone shape as shown in FIG. 1.

Figure 3:
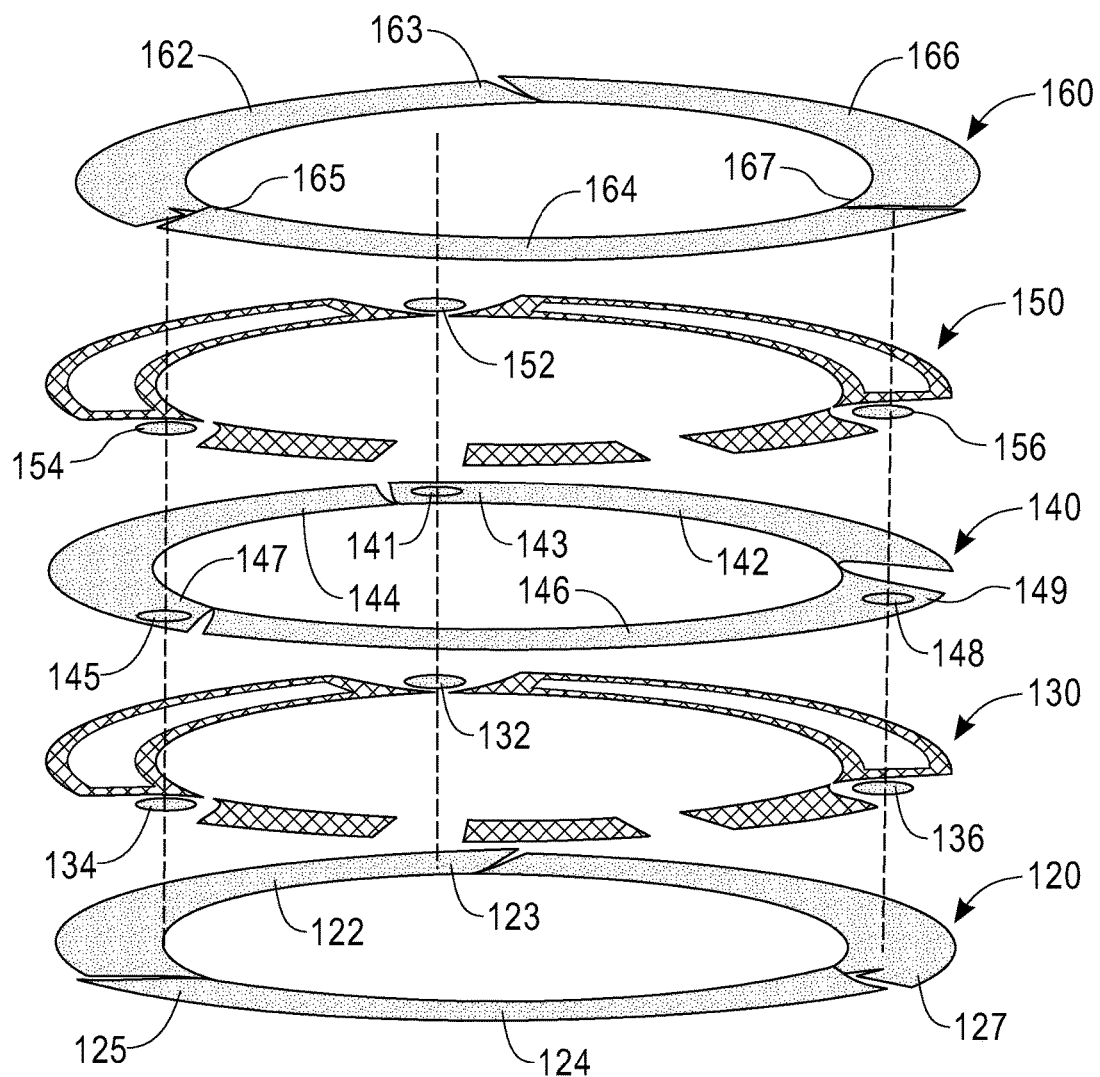
FIG. 3 is an enlarged schematic view showing the deformable closed-loop multi-layered microelectronic device shown in FIG. 2.

FIG. 3 is an enlarged schematic view showing the deformable closed-loop multi-layered microelectronic device of FIG. 2. As shown in FIG. 3, the deformable closed-loop multi-layered microelectronic device 100 includes, in a vertical sequence from the bottom to the top, a bottom layer 120, a middle layer 140 and a top layer 160. The bottom layer 120 includes a first section 122, a second section 124 and a third section 126, which are pivotable with respect to one another to deform the bottom layer 120. The middle layer 140 includes a first section 142, a second section 144 and a third section 146, which are pivotable with respect to one another to deform the middle layer 140. The top layer 160 includes a first section 162, a second section 164 and a third section 166, which are pivotable with respect to one another to deform the top layer 160. The bottom layer 120 and the middle layer 140 are joined with each other through a first adhesive layer 130. The middle layer 140 and the top layer 160 are joined with each other through a second adhesive layer 150. In one embodiment, the first adhesive layer 130 and the second adhesive layer 150 are photo-patterned adhesive layers, which are made of photo-imageable dielectric materials. In another embodiment, the first adhesive layer 130 and the second adhesive layer 150 are made of non-photo-imageable material, such as a thermoplastic bonding material, which can be laser etched or cut.

The first section 162 of the top layer 160 and the first section 122 of the bottom layer 120 are vertically aligned with one another. The second section 164 of the top layer 160 and the second section 124 of the bottom layer 120 are vertically aligned with one another. The third section 166 of the top layer 160 and the third section 126 of the bottom layer 120 are vertically aligned with one another.

Figure 4:
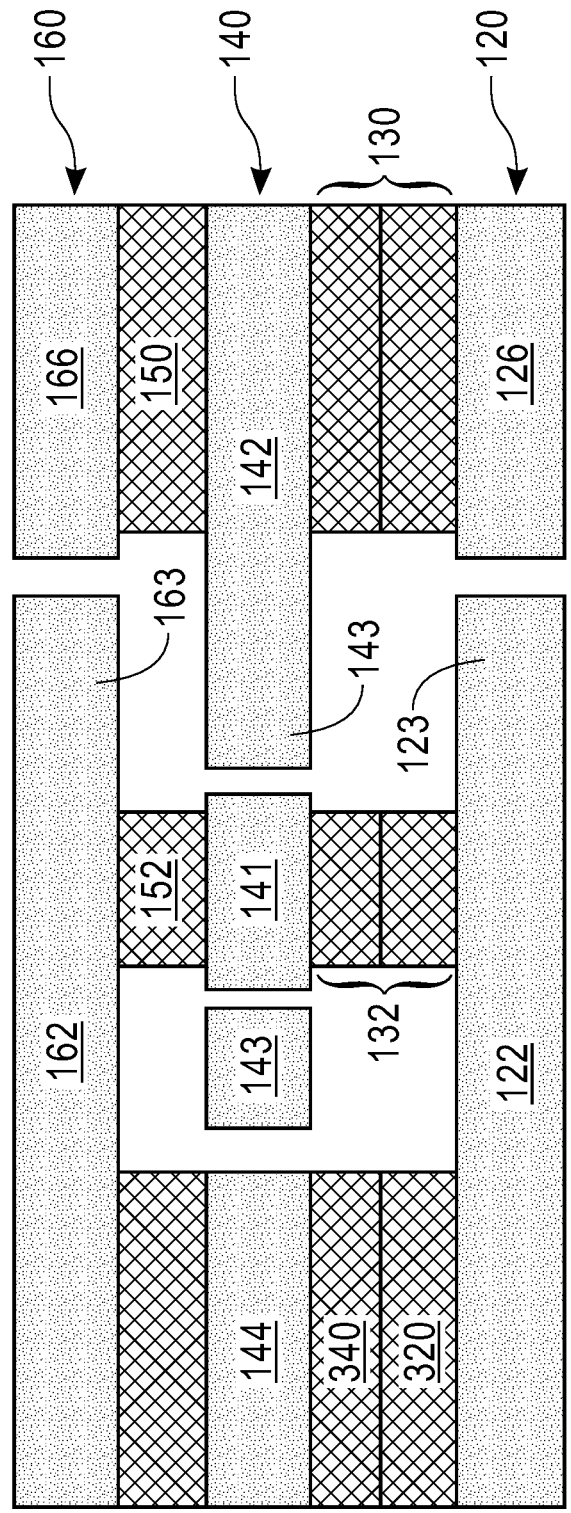
FIG. 4 is a schematic sectional view of the deformable closed-loop multi-layered microelectronic device, along lines 4-4 shown in FIG. 2.

The middle layer 140 includes a first pivot 141, which is provided to a first terminal end 143 of the first section 142. The first pivot 141 can be in the shape of a pivot disk, about which the first terminal end 143 of the first section 142 can rotate. As shown in FIG. 4, the first section 162 of the top layer 160 has a first terminal end 163 and the first section 122 of the bottom layer 120 has a corresponding first terminal end 123. The first terminal ends 163 and 123 are vertically aligned with one another. The first terminal end 143 of the middle layer 140 is vertically sandwiched between the first terminal end 163 of the first section 162 of the top layer 160 and the first terminal end 123 of the first section 122 of the bottom layer 120, and extends into the space between the first terminal end 163 and the first terminal end 123. The first terminal end 123 of the first section 122 of the bottom layer 120 is joined to a bottom surface of the first pivot 141 through a first adhesive 132. The first adhesive 132 is a part of the first adhesive layer 130. The first terminal end 163 of the first section 162 of top layer 160 is joined to a top surface of the first pivot 141 through a second adhesive 152. The second adhesive 152 is a part of the second adhesive layer 150. Once the first terminal end 163 of the first section 162 of the top layer 160 and the first terminal end 123 of the first section 122 of the bottom layer 120 are joined to each other through the first pivot 141, the pivotal movement of the first section 162 of the top layer 160 and the pivotal movement of the first section 122 of the bottom layer 120 can be substantially synchronized in concert, to deform the top layer 160 and the bottom layer 120 in a substantially synchronized manner.

As shown in FIG. 3, in the similar manner, the middle layer 140 further includes a second pivot 145, which is provided to a first terminal end 147 of the second section 144. The second pivot 145 can be in the shape of a pivot disk, through which the first terminal end 147 of the second section 144 can rotate. The second section 164 of the top layer 160 has a first terminal end 165 and the second section 124 of the bottom layer 120 has a corresponding first terminal end 125. The first terminal ends 165 and 125 are vertically aligned with one another. The first terminal end 147 of the second section 144 of the middle layer 140 is vertically sandwiched between the first terminal end 165 of the second section 164 of the top layer 160 and the first terminal end 125 of the second section 124 of the bottom layer 120 and extends into the space between the first terminal end 165 and the first terminal end 125. The first terminal end 125 of the second section 124 of the bottom layer 120 is joined to a bottom surface of the first pivot 145 through a third adhesive 134. The third adhesive 134 is a part of the first adhesive layer 130. The first terminal end 165 of the second section 164 of the top layer 160 is joined to a top surface of the second pivot 145 through a fourth adhesive 154. The fourth adhesive 154 is a part of the second adhesive layer 150. Once the first terminal end 165 of the second section 164 of the top layer 160 and the first terminal end 125 of the second section 124 of the bottom layer 120 are joined to each other through the second pivot 145, the pivotal movement of the second section 164 of the top layer 160 and the pivotal movement of the second section 124 of the bottom layer 120 can be substantially synchronized in concert, to deform the top layer 160 and the bottom layer 120 in a substantially synchronized manner.

As shown in FIG. 3, in the similar manner, the middle layer 140 further includes a third pivot 148, which is provided to a first terminal end 149 of the third section 146. The third pivot 148 can be in the shape of a pivot disk, through which the first terminal end 149 of the third section 146 can rotate. The third section 166 of the top layer 160 has a first terminal end 167 and the third section 126 of the bottom layer 120 has a corresponding first terminal end 127. The first terminal ends 167 and 127 are vertically aligned with one another. The first terminal end 149 of the third section 146 of the middle layer 140 is vertically sandwiched between the first terminal end 167 of the third section 166 of the top layer 160 and the first terminal end 127 of the third section 126 of the bottom layer 120 and extends into the space between the first terminal end 167 and the first terminal end 127. The first terminal end 127 of the third section 126 of the bottom layer 120 is joined to a bottom surface of the third pivot 148 through a fifth adhesive 136. The fifth adhesive 136 is a part of the first adhesive layer 130. The first terminal end 167 of the third section 166 of the top layer 160 is joined to a top surface of the third pivot 148 through a sixth adhesive 156. The sixth adhesive 156 is a part of the second adhesive layer 150. Once the first terminal end 167 of the third section 166 of the top layer 160 and the first terminal end 127 of the third section 126 of the bottom layer 120 are joined to each other through the third pivot 148, the pivotal movement of the third section 166 of the top layer 160 and the pivotal movement of the third section 126 of the bottom layer 120 can be substantially synchronized in concert, to deform the top layer 160 and the bottom layer 120 in a substantially synchronized manner.

The deformable closed-loop multi-layered microelectronic device 100, according to an embodiment of the present disclosure described above, is formed with pivots through a semiconductor process in the flat geometry. As a result, when the semiconductor structure is released from a substrate, the semiconductor structure can be rotated into the cone shape as shown in FIG. 1.

Figure 5:
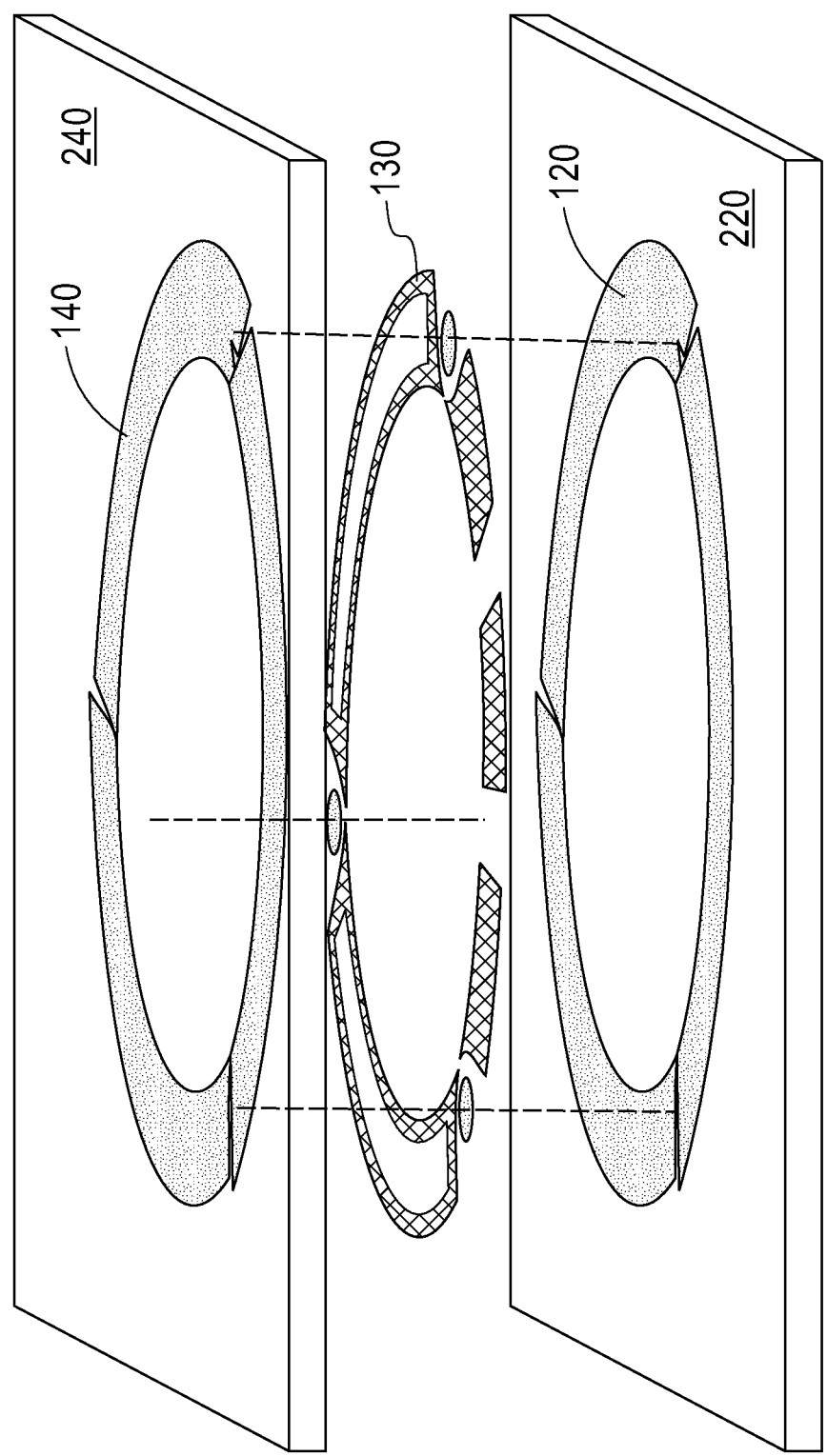
FIG. 5 is a schematic perspective view showing the forming of the deformable closed-loop multi-layered microelectronic device shown in FIG. 2.

FIG. 5 is a schematic perspective view showing the forming of the deformable closed-loop multi-layered microelectronic device 100. First, the bottom layer 120 can be formed through any suitable known semiconductor process, such as lithography, etching and/or laser cutting. The bottom layer 120 can be formed from any suitable semiconductor-based wafer, such as a silicon-based wafer. Alternatively or additionally, the bottom layer 120 can be formed from any suitable polymer-based wafer, which can enhance the flexibility or deformability of the resultant bottom layer 120. The resultant bottom layer 120 is attached to a bottom substrate 220 (also known as a handler), which can be a glass substrate. The bottom layer 120 can be further processed (for example, by laser cutting) to adjust or perfect the dimensions of the bottom layer 120, after being attached to the bottom substrate 220. The resultant bottom layer 120 includes the first section 122, the second section 124 and the third section 126, as described previously.

In the similar manner, the middle layer 140 is formed and attached to a middle substrate 240. The middle layer 120 can be formed through any suitable known semiconductor process, such as lithography, etching and/or laser cutting. The middle layer 140 is formed to include the first section 142 and the respective first pivot 141, the second section 144 and the respective second pivot 145, and the third section 146 and the respective third pivot 148, as described previously. After that, the bottom substrate 220 and the middle substrate 240 are compressed toward each other to align the bottom layer 120 with the middle layer 140 and to join the bottom layer 120 to the middle layer 140 through the first adhesive layer 130.

Referring back to FIG. 4, an embodiment of the first adhesive layer 130 will be described. The first adhesive layer 130 includes a first sub-layer 320 formed and patterned on the bottom layer 120 and a second sub-layer 340 formed and patterned on the middle layer 140. The first sub-layer 320 and the second sub-layer 340 have substantially the same profile and are vertically aligned to face each other. Thus, by properly compressing the bottom substrate 220 and the middle substrate 240 together, the first sub-layer 320 and the second sub-layer 340 are adhered to each other to join the bottom layer 120 and the middle layer 140. Once the bottom layer 120 and the middle layer 140 are properly joined, the middle substrate 240 is removed by any suitable known process. As a result, the joined bottom layer 120 and middle layer 140 remain on the bottom substrate 220.

Figure 6:
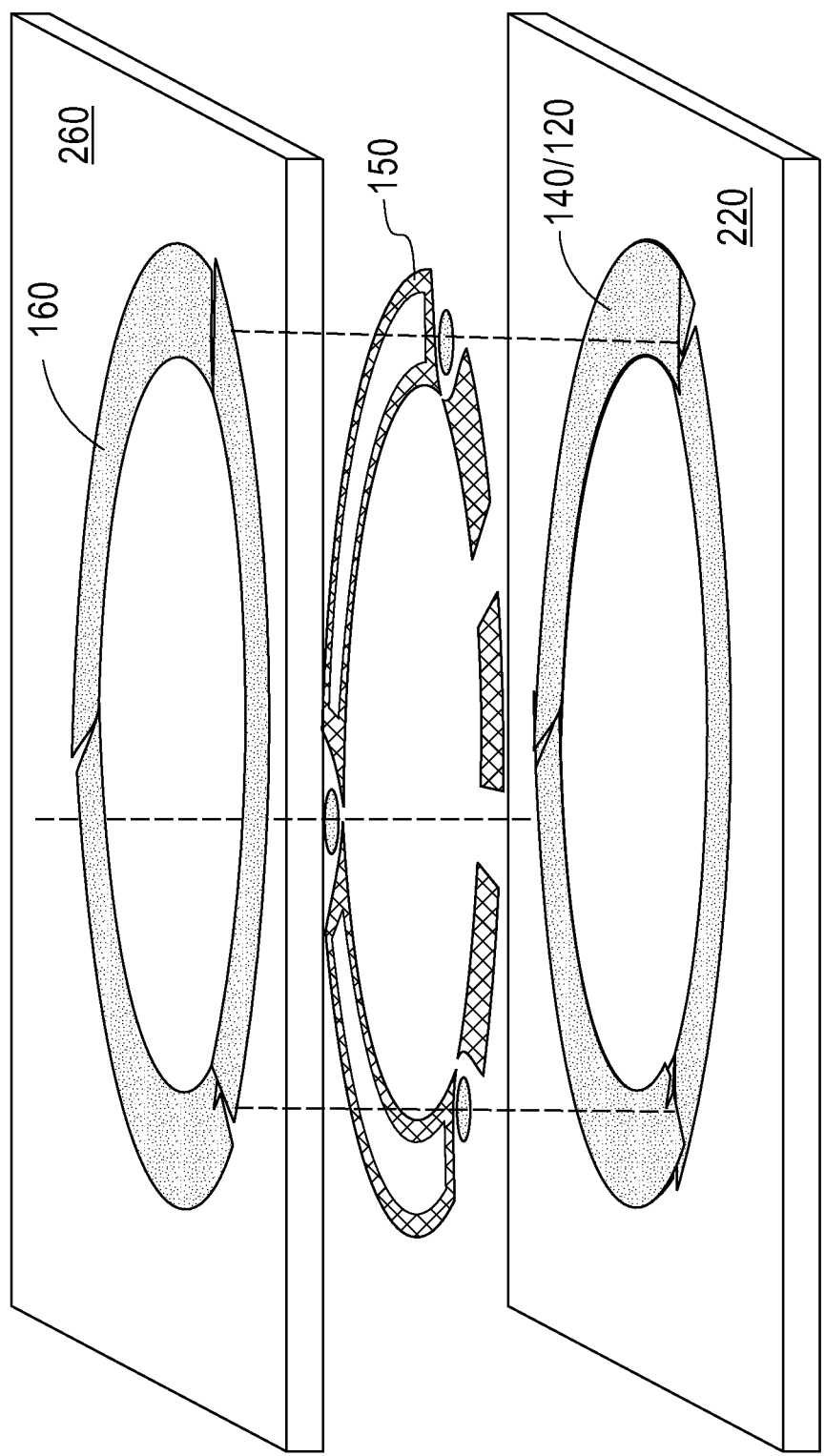
FIG. 6 is another schematic perspective view showing the forming of the deformable closed-loop multi-layered microelectronic device shown in FIG. 2.

FIG. 6 is another schematic perspective view showing the forming of the deformable closed-loop multi-layered microelectronic device 100, after the process shown in FIG. 5. The top layer 160 can be formed in the similar manner for forming the bottom layer 120 and the middle layer 140. The top layer 160 can be formed through any suitable known semiconductor process, such as lithography, etching and/or laser cutting. The top layer 160 is attached to a top substrate 260. The top layer 160 is formed to include the first section 162, the second section 164 and the third section 166, as described previously. After that, the top substrate 260 and the bottom substrate 220 are compressed toward each other to align the top layer 160 with the middle layer 140 (already attached with the bottom layer 120) and to attach the top layer 16 to the middle layer 140 through the second adhesive layer 150. The second adhesive layer 150 can be formed and patterned on the top layer 160, as shown in FIG. 4. Thus, by properly compressing the top substrate 260 and the bottom substrate 220 together, the top layer 160 and the middle layer 140 are joined together. Once the top layer 160 and the middle layer 140 are properly joined, the top substrate 260 is removed by any suitable known process. As a result, the joined top layer 160, middle layer 140 and bottom layer 120 remain on the bottom substrate 220, which include the pivotable structures as previously described with reference to FIGS. 3 and 4.

The joined top layer 160, middle layer 140 and bottom layer 120 remain on the bottom substrate 220 can be released from the bottom substrate 220 by removing the bottom substrate 220 through any suitable known process, such as a semiconductor process. The joined top layer 160, middle layer 140 and bottom layer 120 can be processed to allow self-forming of the cone-shaped structure as shown in FIG. 1. For example, the bottom layer 120 (i.e., the interior layer of the cone-shaped structure) can be formed to be more tensile than the top layer 160 (i.e., the exterior layer of the cone-shaped structure) to achieve the self-forming of the cone-shaped semiconductor structure. Alternatively or additionally, the joined top layer 160, middle layer 140 and bottom layer 120 can be slipped over a mandrel, to encourage the forming of the cone-shaped structure.

Although an embodiment of the present disclosure has been elaborated with reference to a cone-shaped structure, it should be understood that the spirit of the present disclosure is not limited to the cone-shaped structure with three pivotable sections and three associated pivots. The present disclosure includes various deformable closed-loop multi-layered microelectronic device, which can be deformed into any suitable non-planar structures depending on the various numbers of pivotable sections, the various shapes of the pivotable sections and the various numbers and locations of the pivots. For example, the present disclosure also includes a deformable closed-loop multi-layered microelectronic device, which can be deformed or self-deformed into a cylindrical structure. The cylindrical structure typically includes four pivotable sections and fourth associated pivots. In addition, the deformable closed-loop multi-layered microelectronic devices according to the present disclosure can have more than three active layers.

Figure 7:
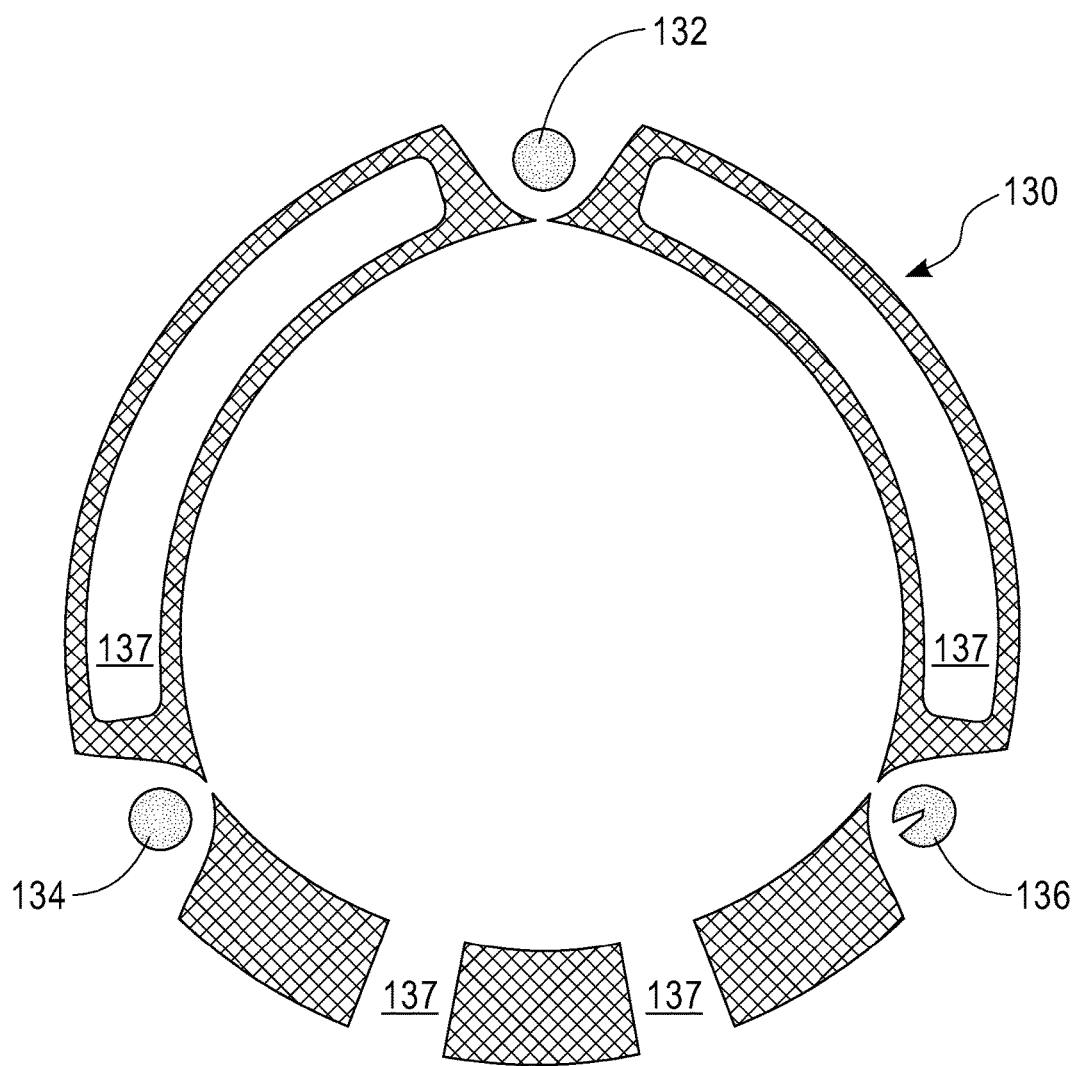
FIG. 7 is a schematic plan view showing a pattern of an adhesive layer, which is formed on a bottom layer of the deformable closed-loop multi-layered microelectronic device shown in FIG. 2.

FIG. 7 is a schematic plan view showing a pattern of the first adhesive layer 130, which is formed on the bottom layer 120 of the deformable closed-loop multi-layered microelectronic device 100. Other than providing the first adhesive 132, the third adhesive 134 and the fifth adhesive 136, the first adhesive layer 130 further provides a plurality of through cavities 137. The through cavities 137 can be formed through photo-patterning or laser cutting/etching, for example. The through cavities 137 provide spaces for forming batteries, dies and/or other suitable active components for the bottom layer 120 and/or the middle layer 140. Similarly, the second adhesive layer 150 can have cavities for forming batteries, dies and/or other suitable active components for the middle layer 140 and/or the top layer 160. Moreover, the middle layer 140 can also have cavities for forming batteries, dies and/or other suitable active components. A conducting paste can be added during the manufacture of the deformable closed-loop multi-layered microelectronic device 100, for enabling electrical coupling between components of the bottom layer 120 and components of the top layer 160.

Figure 8:
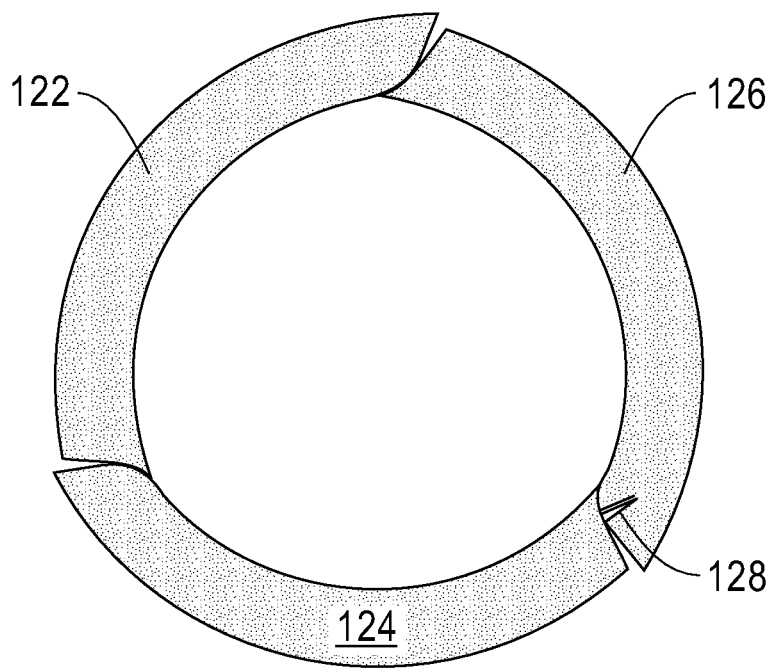
FIG. 8 is a schematic plan view showing the bottom layer of the deformable closed-loop multi-layered microelectronic device, which layer includes a flexing electrical connection.

FIG. 8 is a schematic plan view showing the bottom layer 120 of the deformable closed-loop multi-layered microelectronic device 100. The bottom layer 120 includes a flexing electrical connection 128 provided at a pivot region between the second section 124 and the third section 126 of the bottom layer 120.

Figure 9:
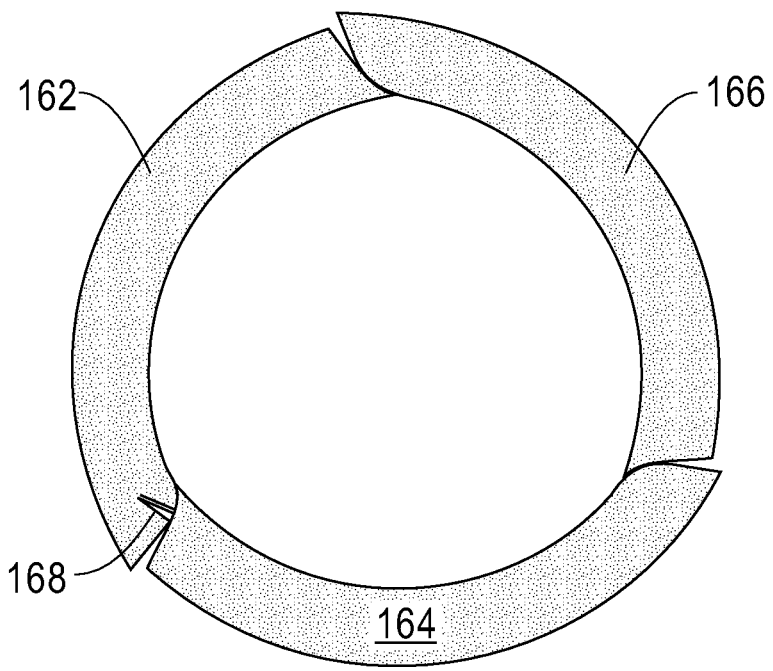
FIG. 9 is a schematic plan view showing the top layer of the deformable closed-loop multi-layered microelectronic device, which layer includes a flexing electrical connection.

FIG. 9 is a schematic plan view showing the top layer 160 of the deformable closed-loop multi-layered microelectronic device 100. The top layer 120 includes a flexing electrical connection 168 provided at a pivot region between the first section 162 and the second section 164 of the top layer 160.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A deformable closed-loop multi-layered microelectronic device comprising:
   a top layer comprising at least a first section and a second section, wherein the first section and the second section of the top layer are pivotable with respect to each other to deform the top layer;
   a bottom layer comprising at least a first section and a second section, wherein the first section of the bottom layer is vertically aligned with the first section of the top layer and the second section of the bottom layer is vertically aligned with the second section of the top layer, wherein the first section and the second section of the bottom layer are pivotable with respect to each other to deform the bottom layer; and
   a middle layer disposed between the top layer and the bottom layer, the middle layer comprising at least a first section and a second section, wherein the first section and the second section of the middle layer are pivotable with respect to each other to deform the middle layer,
   wherein the middle layer comprises a first pivot provided to a first terminal end of the first section of the middle layer for allowing the first section to rotate about the first pivot, wherein the first terminal end of the first section of the middle layer is vertically sandwiched between a first terminal end of the first section of the top layer and a first terminal end of the first section of the bottom layer; and
   wherein the first pivot is connected to the first terminal end of the first section of the bottom layer through a first adhesive and connected to the first terminal end of the first section of the top layer through a second adhesive, such that the first section of the bottom layer and the first section of the top layer are pivotable in a substantially synchronized manner to deform the bottom layer and the top layer in a substantially synchronized manner.

2. The deformable closed-loop multi-layered microelectronic device according to claim 1,
   wherein the middle layer comprises a second pivot provided to a first terminal end of the second section of the middle layer for allowing the second section to rotate about the second pivot, wherein the first terminal end of the second section of the middle layer is vertically sandwiched between a first terminal end of the second section of the top layer and a first terminal end of the second section of the bottom layer; and
   wherein the second pivot is connected to the first terminal end of the second section of the bottom layer through a third adhesive and connected to the first terminal end of the second section of the top layer through a fourth adhesive, such that the second section of the bottom layer and the second section of the top layer are pivotable in a substantially synchronized manner.

3. The deformable closed-loop multi-layered microelectronic device according to claim 2, further comprising:
   a first adhesive layer formed on a top surface of the bottom layer, wherein the first adhesive layer provides the first adhesive and the third adhesive; and
   a second adhesive layer formed on a bottom surface of the top layer, wherein the second adhesive layer provides the second adhesive and the fourth adhesive.

4. The deformable closed-loop multi-layered microelectronic device according to claim 2,
   wherein the top layer comprises a third section that is pivotable with respect to the first section and the second section of the top layer to deform the top layer;
   wherein the bottom layer comprises a third section that is vertically aligned with the third section of the top layer and pivotable with respect to the first section and the second section of the bottom layer to deform the bottom layer;
   wherein the middle layer comprises a third section that is pivotable with respect to the first section and the second section of the middle layer to deform the middle layer;
   wherein the middle layer comprises a third pivot provided to a first terminal end of the third section of the middle layer for allowing the third section to rotate about the third pivot, wherein the first terminal end of the third section of the middle layer is vertically sandwiched between a first terminal end of the third section of the top layer and a first terminal end of the third section of the bottom layer; and wherein the third pivot is connected to the first terminal end of the third section of the bottom layer through a fifth adhesive and connected to the first terminal end of the third section of the top layer through a sixth adhesive, such that the third section of the bottom layer and the third section of the top layer are pivotable in a substantially synchronized manner.

5. The deformable closed-loop multi-layered microelectronic device according to claim 4, further comprising:

a first adhesive layer formed on a top surface of the bottom layer, wherein the first adhesive layer provides the first adhesive, the third adhesive and the fifth adhesive; and a second adhesive layer formed on a bottom surface of the top layer, wherein the second adhesive layer provides the second adhesive, the fourth adhesive and the sixth adhesive.

6. The deformable closed-loop multi-layered microelectronic device according to claim 2, wherein the first section and the second section of the top layer are flat prior to deformation;

wherein the first section and the second section of the bottom layer are flat prior to deformation; and wherein the first section and the second section of the middle layer are flat prior to deformation.

7. The deformable closed-loop multi-layered microelectronic device according to claim 4, wherein the first section, the second section and the third section of the top layer are flat prior to deformation of the top layer;

wherein the first section, the second section and the third section of the bottom layer are flat prior to deformation of the bottom layer; and wherein the first section, the second section and the third section of the middle layer are flat prior to deformation of the middle layer.

8. The deformable closed-loop multi-layered microelectronic device according to claim 7, wherein the first section, the second section and the third section of the top layer form a first cone after the deformation of the top layer;

wherein the first section, the second section and the third section of the bottom layer form a second cone after the deformation of the bottom layer;

wherein the first section, the second section and the third section of the middle layer form a third cone after the deformation of the middle layer; and wherein the first cone, the second cone and the third cone are co-axial.

9. The deformable closed-loop multi-layered microelectronic device according to claim 3, wherein the first adhesive layer comprises spaces for forming active components between the bottom layer and the middle layer; and wherein the second adhesive layer comprises spaces for forming active components between the middle layer and the top layer.

10. The deformable closed-loop multi-layered microelectronic device according to claim 5, wherein the first adhesive layer comprises spaces for forming active components between the bottom layer and the middle layer; and wherein the second adhesive layer comprises spaces for forming active components between the middle layer and the top layer.

11. The deformable closed-loop multi-layered microelectronic device according to claim 2, wherein the first pivot and the second pivot each comprise a pivot disc.

12. The deformable closed-loop multi-layered microelectronic device according to claim 5, wherein the first pivot, the second pivot and the third pivot each comprise a pivot disc.

13. The deformable closed-loop multi-layered microelectronic device according to claim 1, wherein the top layer is formed from a semiconductor-based wafer or a polymer-based wafer.

14. The deformable closed-loop multi-layered microelectronic device according to claim 1, wherein the middle layer is formed from a semiconductor-based wafer or a polymer-based wafer.

15. The deformable closed-loop multi-layered microelectronic device according to claim 1, wherein the bottom layer is formed from a semiconductor-based wafer or a polymer-based wafer.

16. The deformable closed-loop multi-layered microelectronic device according to claim 1, wherein the top layer, the middle layer and the bottom layer are joined together to provide a multi-layered structure;

wherein prior to a substantially synchronized pivotal movement of the first section of the top layer and the first section of the bottom layer, the multi-layered structure is substantially planar; and wherein after the substantially synchronized pivotal movement of the first section of the top layer and the first section of the bottom layer, the multi-layered structure is non-planar.

* * * * *